(12) United States Patent
Kono et al.

(10) Patent No.: US 7,652,747 B2
(45) Date of Patent: Jan. 26, 2010

(54) IMMERSION EXPOSURE METHOD AND IMMERSION EXPOSURE APPARATUS WHICH TRANSFER IMAGE OF PATTERN FORMED ON MASK ONTO SUBSTRATE THROUGH IMMERSION MEDIUM

(75) Inventors: Takuya Kono, Yokosuka (JP); Kazuya Fukuhara, Tokyo (JP); Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 492 days.

(21) Appl. No.: 11/474,298

(22) Filed: Jun. 26, 2006

(65) Prior Publication Data
US 2007/0008507 A1  Jan. 11, 2007

(30) Foreign Application Priority Data
Jun. 27, 2005  (JP) .............................. 2005-186876

(51) Int. Cl.
*G03B 27/52* (2006.01)
(52) U.S. Cl. .............................. 355/30; 355/52; 355/53; 355/55; 250/492.1
(58) Field of Classification Search .................. 355/30, 355/53, 52, 55, 72, 73, 77; 250/492.1, 492.2, 250/429.22, 548; 430/311
See application file for complete search history.

(56) References Cited

U.S. PATENT DOCUMENTS

| 5,147,823 A * | 9/1992 | Ishibashi et al. ............ 438/694 |
|---|---|---|
| 6,844,206 B1 | 1/2005 | Phan et al. |
| 7,158,896 B1 * | 1/2007 | Singh et al. .................... 702/31 |
| 7,285,231 B2 * | 10/2007 | Weippert .................. 252/408.1 |
| 2003/0094032 A1 * | 5/2003 | Baklanov et al. ................ 73/38 |
| 2003/0118926 A1 * | 6/2003 | Sumi et al. ..................... 430/30 |
| 2003/0211756 A1 * | 11/2003 | Ito et al. ...................... 438/782 |
| 2004/0227891 A1 * | 11/2004 | Hirota ........................ 349/141 |
| 2005/0031973 A1 * | 2/2005 | Kobayashi et al. ............. 430/7 |
| 2005/0068499 A1 * | 3/2005 | Dodoc et al. .................. 353/10 |
| 2006/0012765 A1 * | 1/2006 | Kameyama ................... 355/53 |

FOREIGN PATENT DOCUMENTS

| JP | 2004207710 A * | 7/2004 |
| JP | 2004-258662 | 9/2004 |
| WO | WO 2004086470 A1 * | 10/2004 |

\* cited by examiner

*Primary Examiner*—Diane I Lee
*Assistant Examiner*—Christina Riddle
(74) *Attorney, Agent, or Firm*—Finnegan, Henderson, Farabow, Garrett & Dunner, L.L.P.

(57) ABSTRACT

This invention discloses an immersion exposure method which executes immersion exposure for an exposure target film by transferring an image of a pattern formed on a mask onto the exposure target film through an immersion medium. A first vapor pressure as the target value in an immersion exposure atmosphere which surrounds the immersion medium is set. A second vapor pressure in the immersion exposure atmosphere is measured. The first vapor pressure is compared with the second vapor pressure. Whether to adjust the vapor pressure in the immersion exposure atmosphere is selected in accordance with the comparison result.

18 Claims, 6 Drawing Sheets

IMMERSION EXPOSURE METHOD AND IMMERSION EXPOSURE APPARATUS WHICH TRANSFER IMAGE OF PATTERN FORMED ON MASK ONTO SUBSTRATE THROUGH IMMERSION MEDIUM

CROSS-REFERENCE TO RELATED APPLICATIONS

This application is based upon and claims the benefit of priority from prior Japanese Patent Application No. 2005-186876, filed Jun. 27, 2005, the entire contents of which are incorporated herein by reference.

BACKGROUND OF THE INVENTION

1. Field of the Invention

The present invention relates to an immersion exposure method and immersion exposure apparatus.

2. Description of the Related Art

An immersion exposure method transfers a mask pattern image onto a substrate through an immersion medium while filling, with the immersion medium, at least one portion of the space between the substrate surface and the lower surface of a projection optical system. The immersion exposure method increases the resolution by taking advantage of the fact that the wavelength of exposure light in an immersion medium is 1/n times that in the air when the refractive index of the immersion medium is defined as n. The immersion exposure method can increase the resolution without greatly changing the arrangements of the conventional exposure apparatuses, and is therefore receiving a great deal of attention now (see, e.g., Jpn. Pat. Appln. KOKAI Publication No. 2004-207710).

If the vapor pressure in an immersion exposure atmosphere is smaller than the saturated vapor pressure in immersion exposure, the immersion medium vaporizes from the surface in contact with the immersion exposure atmosphere. A variation in temperature of the immersion medium due to heat of vaporization varies the refractive index of the immersion medium. When the refractive index of the immersion medium varies, the imaging characteristics of the exposure apparatus optical system vary. This causes an error in position of an image formed on a substrate. When the substrate surface to be subjected to immersion exposure gets wet, the moisture in the substrate or the components and moisture of a photoresist arranged on the substrate migrate toward the substrate surface by the chromatography effect. The components that have migrated to the substrate surface mix with the immersion medium. This contaminates the immersion medium, resulting in a variation in its refractive index. As the substrate gets drier, the migrated substances alone remain on the substrate surface and disturb the annealing and development steps after exposure in pattern formation. Still worse, migration of the photoresist components warps the photoresist. To cope with these problems, a technique for preventing evaporation of an immersion medium to control a variation in its refractive index has been demanded.

As a means for solving the above problems, for example, Jpn. Pat. Appln. KOKAI Publication No. 2004-258662 proposes a method of specifying components of an immersion medium to prevent evaporation. However, this method requires adjustment of the components of the immersion medium in accordance with the substrate surface conditions and exposure environment. This complicates the adjustment operation.

BRIEF SUMMARY OF THE INVENTION

According to a first aspect of the present invention, there is provided an immersion exposure method which executes immersion exposure for an exposure target film by transferring an image of a pattern formed on a mask onto the exposure target film through an immersion medium, comprising: setting a first vapor pressure as a target value in an immersion exposure atmosphere which surrounds the immersion medium; measuring a second vapor pressure in the immersion exposure atmosphere; comparing the first vapor pressure with the second vapor pressure; and selecting whether to adjust a vapor pressure in the immersion exposure atmosphere in accordance with the comparison result.

According to a second aspect of the present invention, there is provided an immersion exposure apparatus comprising: a projection optical system which projects an image of a pattern formed on a mask onto an exposure target film; a substrate stage which holds a substrate on which the exposure target film is formed; an immersion medium supply unit which supplies an immersion medium to at least one portion of a space between the exposure target film and a termination portion of the projection optical system; a measurement unit which measures a vapor pressure in an immersion exposure atmosphere which surrounds the immersion medium; and a control unit which compares the measured vapor pressure with a predetermined vapor pressure set in advance, and adjusts the vapor pressure in the immersion exposure atmosphere if the measured vapor pressure does not coincide with the predetermined vapor pressure.

According to a third aspect of the present invention, there is provided a semiconductor device manufacturing method comprising: forming an exposure target film on a substrate; supplying an immersion medium to at least one portion of a space between the exposure target film and a projection optical system which projects an image of a pattern formed on a mask onto the exposure target film; setting a first vapor pressure as a target value in an immersion exposure atmosphere which surrounds the immersion medium; measuring a second vapor pressure in the immersion exposure atmosphere; transferring the image of the pattern formed on the mask onto the exposure target film through the immersion medium; comparing the first vapor pressure with the second vapor pressure; and selecting whether to adjust a vapor pressure in the immersion exposure atmosphere in accordance with the comparison result.

DETAILED DESCRIPTION OF THE INVENTION

Embodiments of the present invention will be explained below, but the present invention is not limited to the following embodiments. The same or similar reference numerals denote parts having the same or similar functions throughout the drawings, and a repetitive description thereof will be omitted.

Immersion Exposure Apparatus

Figure 1:
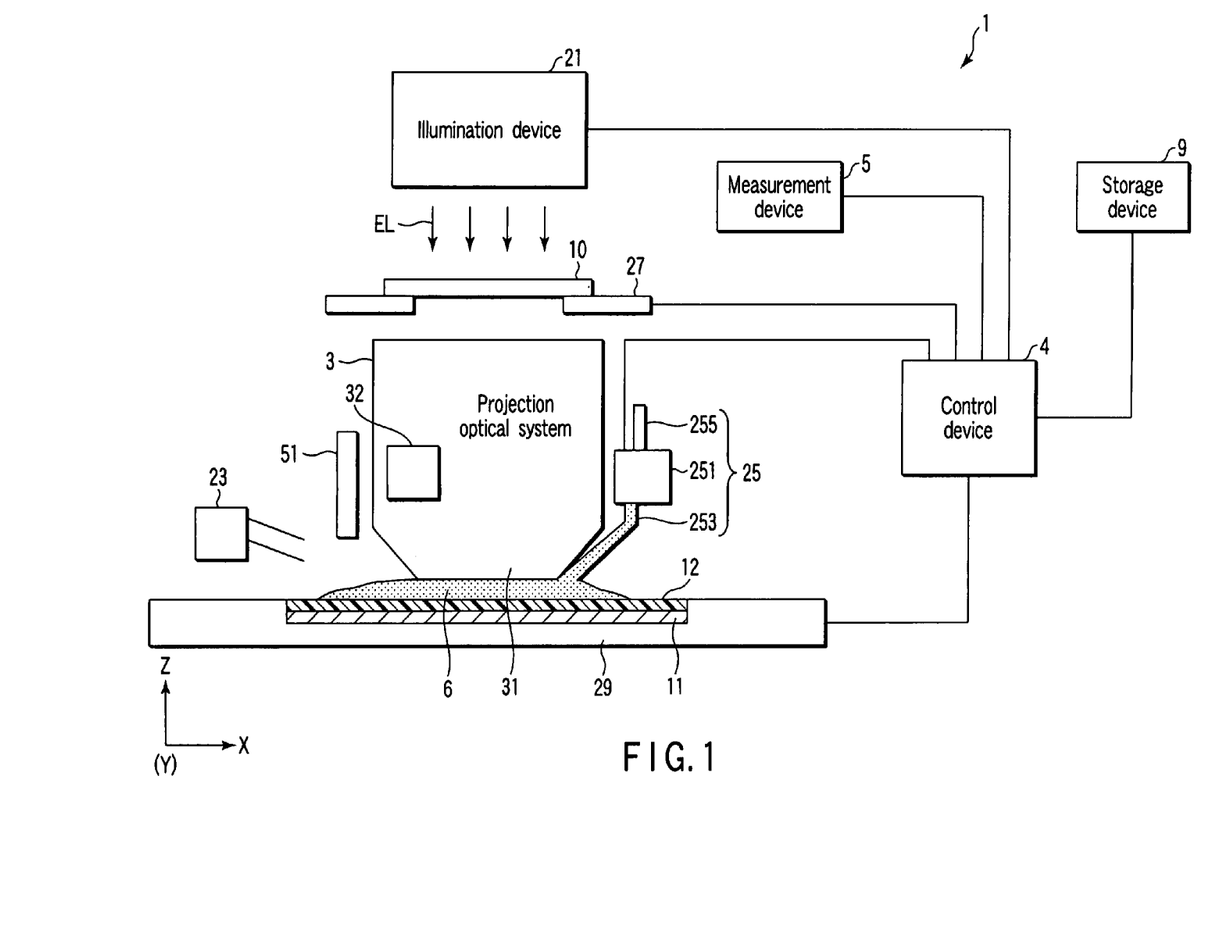
FIG. 1 is a view (side view along the X and Z axes) showing the schematic arrangement of an immersion exposure apparatus according to an embodiment of the present invention.

As shown in FIG. 1, an immersion exposure apparatus 1 according to an embodiment of the present invention comprises an illumination device 21, mask stage 27, projection optical system 3, substrate stage 29, immersion medium 6, immersion medium supply device 25, humidifier 23, control device 4, measurement device 5, and storage device 9.

A mask 10 is interposed between the illumination device 21 and the projection optical system 3. The mask stage 27 supports the mask 10. An exposure target film 12 is formed on the major surface of a substrate 11. The substrate stage 29 holds the substrate 11 on which the exposure target film 12 is formed. The projection optical system 3 projects an image of a pattern formed on the mask 10 onto the exposure target film 12. The projection optical system 3 has a projection optical system termination portion 31 on the exposure target film 12 side. The immersion medium supply device 25 supplies the immersion medium 6 to at least one portion of the space between the projection optical system termination portion 31 and the exposure target film 12. The measurement device 5 measures the vapor pressure in an immersion exposure atmosphere which surrounds the immersion medium 6. The control device 4 compares the vapor pressure measured by the measurement device 5 with a predetermined vapor pressure set in advance. If they do not coincide, the control device 4 adjusts the vapor pressure in the immersion exposure atmosphere. The storage device 9 is connected to the control device 4 to store a database associated with immersion exposure.

The illumination device 21 has a light source and an illumination system to illuminate the mask 10 with light from the light source. As the light source, an argon fluoride (ArF) excimer laser with a wavelength of around 193 nm or a krypton fluoride (KrF) excimer laser with a wavelength of around 248 nm is available. Exposure light EL from the illumination device 21 illuminates the mask 10 as a master. The pattern of the mask 10 is reduced by the projection optical system 3 and projected and transferred onto the exposure target film 12 formed on the substrate 11.

The mask 10 is fixed on the mask stage 27 as a mask holding means, and its position is adjusted. The projection optical system termination portion 31 forms a part of the projection optical system 3 and serves as a member arranged at the nearest position to the substrate. The projection optical system termination portion 31 includes, e.g., a lens as an optical element. The lower surface of the projection optical system termination portion 31, i.e., the surface which faces the exposure target film 12 is flat.

The mask stage 27 supports the mask 10. The mask stage 27 is two-dimensionally movable in a plane perpendicular to the optical axis of the projection optical system 3, i.e., the X-Y plane, and is slightly rotatable in the Z direction. The mask stage 27 is driven by a mask stage driving device (not shown) such as a linear motor. The mask stage driving device is controlled by the control device 4. A meter (not shown) which can align the mask 10 is attached to the mask stage 27.

The projection optical system 3 projects and forms by exposure the pattern of the mask 10 on the exposure target film 12 with a predetermined projection magnification. The projection optical system 3 comprises a plurality of optical elements including an optical element formed at the leading edge on the exposure target film 12 (substrate 11) side. The projection optical system 3 also comprises an imaging characteristic control device 32 which can adjust its imaging characteristics (optical characteristics). The imaging characteristic control device 32 includes an optical element driving mechanism and pressure adjustment mechanism. The optical element driving mechanism can move some of the plurality of optical elements which form the projection optical system 3. The pressure adjustment mechanism adjusts the pressure in a specific one of the spaces between a plurality of optical elements in a lens barrel. The optical element driving mechanism moves a specific optical element of the plurality of optical elements of the projection optical system 3 in the direction of the optical axis, or tilts it with respect to the optical axis. The imaging characteristic control device 32 is controlled by the control device 4. The control device 4 adjusts the projection magnification and imaging position of the projection optical system 3 through the imaging characteristic control device 32.

As an optical element which comes in contact with the immersion medium 6, a lens or plane-parallel plate is available. Since a plane-parallel plate is less expensive than a glass, it can be conveniently replaced at a lower cost than in a case wherein a lens is used as the optical element which comes into contact with the immersion medium 6. That is, an optical element which comes in contact with the immersion medium 6 needs to be replaced periodically, i.e., every time the surface of the optical element is contaminated due to scattered particles generated upon irradiating a photoresist with exposure light, or adhesion of impurities in the immersion medium 6. In this case, using an inexpensive plane-parallel plate as the optical element makes it possible to reduce the cost of replacement components and shorten the replacement time as compared with a lens. In this embodiment, the space between the projection optical system 3 and the surface of the substrate 11 is filled with the immersion medium 6. However, for example, the space may be filled with the immersion medium 6 while a cover glass including a plane-parallel plate is attached to the surface of the substrate 11.

The substrate 11 is arranged on the substrate stage 29 which can adjust its position in the horizontal and vertical directions. The substrate 11 is prepared by forming a film member on a device base material, e.g., a semiconductor substrate or glass substrate. The film member includes a photoresist layer or a top coat layer (protective layer) formed, as the exposure target film 12, on the photoresist layer. Therefore, the exposure target film 12 formed on the uppermost layer on the substrate 11 forms a liquid contact surface which comes in contact with the immersion medium 6 in immersion exposure. As the exposure target film 12, for example, P6111 which is manufactured by Tokyo Ohka Kogyo Co., Ltd. and serves as the photoresist layer (main film) is adopted. As the top coat layer on the main film, for example, TSP-3A manufactured by Tokyo Ohka Kogyo Co., Ltd is adopted. The vapor pressure and the like in the immersion exposure apparatus are determined in accordance with the material characteristics of the exposure target film 12, especially, the wettability or contact angle with respect to the liquid for use.

The substrate stage 29 supports the substrate 11. The substrate stage 29 is driven by a substrate stage driving device (not shown) such as a linear motor. The substrate stage driving device is controlled by the control device 4.

The immersion medium supply device 25 receives the immersion medium 6 supplied from a liquid supply pipe 255, and discharges it from an immersion medium supply device main body 251 through a nozzle 253 to fill the space between the projection optical system termination portion 31 and the exposure target film 12 with the immersion medium 6. The nozzle 253 draws the immersion medium 6 by suction as needed. Discharge and suction of the immersion medium 6 are controlled by the immersion medium supply device 25.

The immersion medium 6 uses a material which transmits exposure light without absorbing it as much as possible, and which does not corrode as much as possible the exposure target film 12 formed on the substrate 11. The immersion medium 6 may use, e.g., pure water if the exposure light is an ArF laser beam. If the exposure light is a fluorine ($F_2$) laser, the immersion medium 6 may use a fluorine-based fluid such as a fluorine-based oil which can transmit an $F_2$ laser beam.

The humidifier 23 is so formed as to supply a saturated vapor pressure gas to the atmosphere. The humidifier 23 is preferably arranged near the projection optical system 3.

Figure 2:
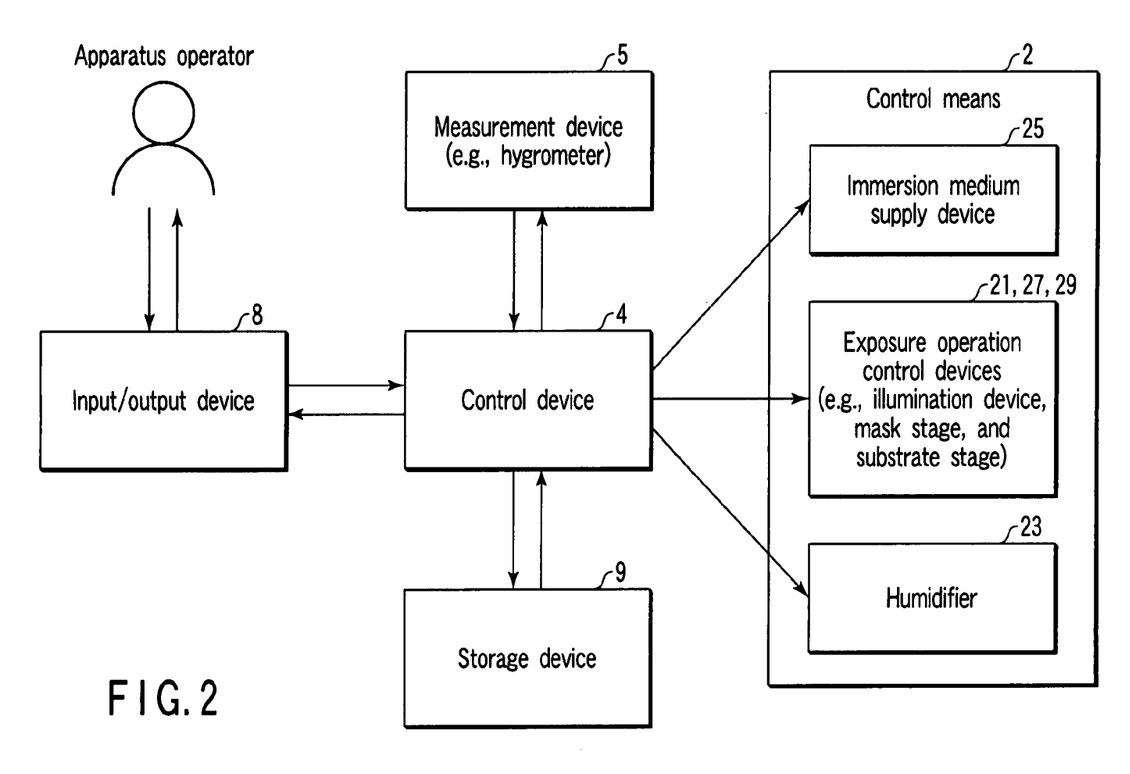
FIG. 2 is a block diagram showing a control system of an immersion exposure apparatus according to the embodiment of the present invention.

As shown in FIG. 2, the control device 4 is connected to the measurement device 5, a control means 2, the storage device 9, and an input/output device 8. The control means 2 includes, e.g., the humidifier 23, the immersion medium supply device 25, and an exposure operation control device. The exposure operation control device includes, e.g., the illumination device 21, mask stage 27, and substrate stage 29. The input/output device 8 includes input devices and output devices. As the input devices, for example, pointing devices such as a keyboard and mouse are available. As the output devices, for example, image display devices such as a liquid crystal display and monitor are available. If the vapor pressure in the immersion exposure atmosphere which surrounds the immersion medium 6 does not coincide with a predetermined vapor pressure (e.g., saturated vapor pressure) stored in the storage device 9, the control device 4 activates the control means 2 to adjust the vapor pressure in the immersion exposure atmosphere. The control device 4 may comprise a normal computer system including a CPU and storage devices such as a ROM, RAM, and magnetic disk connected to the CPU.

The measurement device 5 measures the vapor pressure in a chamber (not shown) which forms the immersion exposure atmosphere. More specifically, the measurement device 5 comprises a hygrometer 51, thermometer, and barometer. The hygrometer 51 is preferably arranged near the projection optical system 3.

The storage device 9 stores, as a database, various types of information associated with immersion exposure which contain the predetermined vapor pressure. The database contains the vapor pressures as functions of the temperature and pressure. In addition to the temperature and pressure, the database contains the vapor pressures as functions of information about the substrate 11, film member information of the exposure target film 12, and information about the immersion medium 6. The database further contains the material characteristics (e.g., volatility, viscosity, density, and surface tension) of the immersion medium 6 and contact angle information of the immersion medium 6 with respect to the exposure target film 12 formed on the substrate 11. The database still further contains the manufacturing conditions of the substrate 11, e.g., the film formation, polishing, etching, and oxidation conditions of the surface of the substrate 11.

The storage device 9 may further save the supply conditions of the immersion medium 6 to the surface of the exposure target film 12 and the recovery conditions of the immersion medium 6 from the surface of the exposure target film 12. Moreover, various exposure target films 12 and the types of liquids suitable for the exposure target films 12 may be examined in advance to cause the storage device 9 to store their combinations and conditions suitable for these combinations. The information about the exposure target film 12 contains the material of a photoresist, the manufacturer, and the product number.

The database stored in the storage device 9 may be updated anytime in the following way. That is, when a substrate 11 having an exposure target film 12 of a different type is to be exposed, or when an immersion medium 6 of a new type is to be used, the new exposure target film 12 or immersion medium 6 may undergo, e.g., examinations to create the above database. The database in the storage device 9 can also be updated from a remote site via a communication network including, e.g., the Internet. As the storage device 9, for example, a recording medium which records a program, such as a semiconductor memory, magnetic disk, optical disk, magnetooptical disk, or magnetic tape is available.

The immersion exposure apparatus 1 is of a step & scan scheme. The immersion exposure apparatus 1 synchronously scans the mask 10 and substrate 11 to perform exposure.

Immersion Exposure Method

Figure 3:
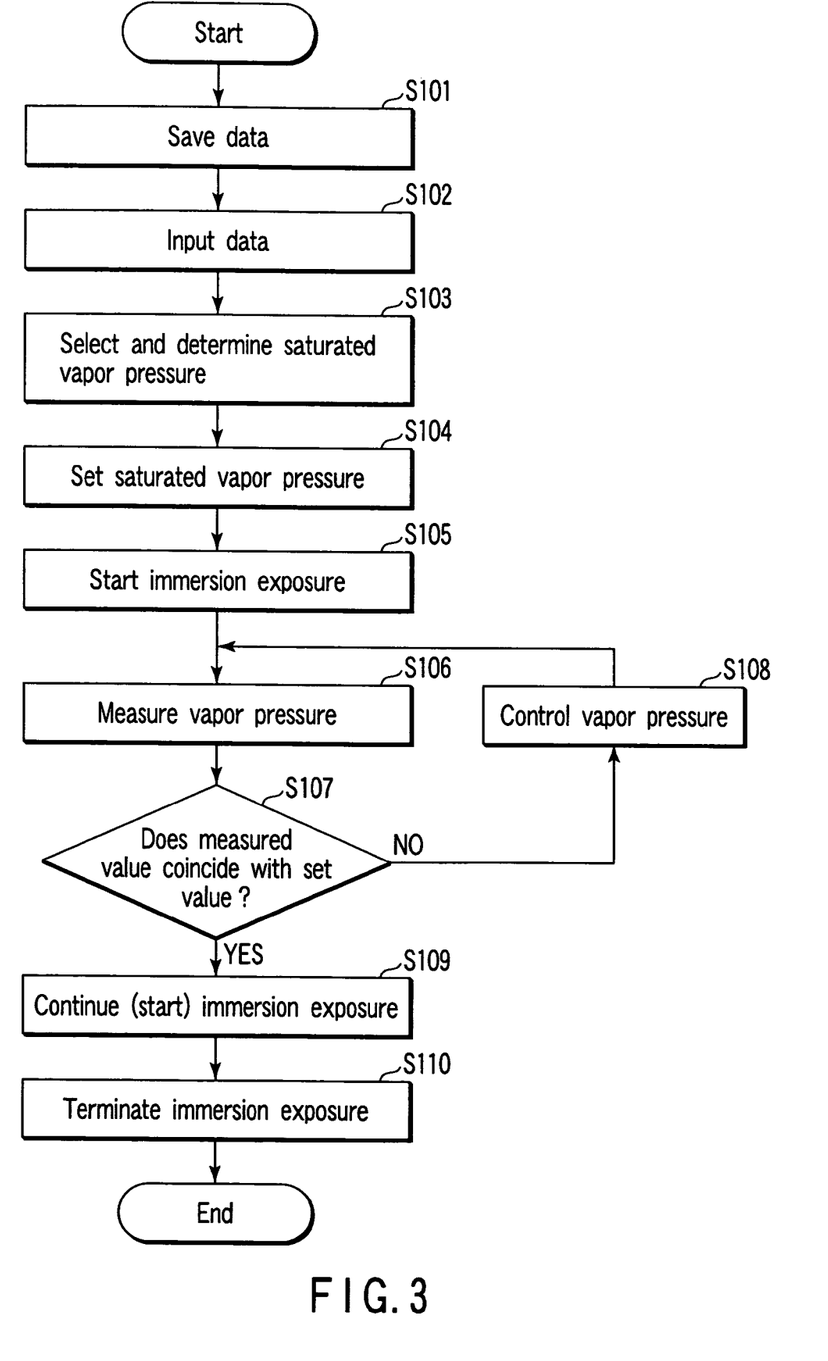
FIG. 3 is a flowchart showing an immersion exposure method according to the embodiment of the present invention.

An embodiment of an immersion exposure method using the immersion exposure apparatus 1 in FIG. 1 will be explained below with reference to the flowchart in FIG. 3. The immersion exposure method transfers an image of a pattern formed on the mask 10 onto the exposure target film 12 through the immersion medium 6 to apply immersion exposure to the exposure target film 12.

(a) In step S101, a database which is associated with the vapor pressure, e.g., the saturated vapor pressure of an immersion medium in an immersion exposure atmosphere, which prevents evaporation of the immersion medium and surrounds the immersion medium is stored in the storage device 9.

(b) In step S102, the temperature, the pressure, information about the substrate 11 on which the exposure target film 12 is formed, film member information of the exposure target film 12, and information about the immersion medium 6 are input to the control device 4 via the input devices. In step S103, in accordance with the input information, the control device 4 is allowed to select and determine the saturated vapor pressure by referring to the database stored in the storage device 9 in advance.

(c) In step S104, the vapor pressure in the immersion exposure apparatus 1 (in the immersion exposure atmosphere) is set to the above saturated vapor pressure of the immersion medium. In step S105, the immersion exposure apparatus 1 is activated to start immersion exposure.

(d) In step S106, the vapor pressure in the immersion exposure apparatus 1 is measured in parallel with immersion exposure.

(e) In step S107, the measured vapor pressure is compared with the above saturated vapor pressure. If they coincide, immersion exposure continues in step S109. If they do not coincide, the exposure target film 12 undergoes immersion exposure while adjusting the vapor pressure in step S108. To adjust the vapor pressure, the control device 4 is activated. More specifically, if the vapor pressure in the chamber is lower than the saturated vapor pressure, the humidifier 23 is activated to increase the vapor pressure.

If the contact angle of the immersion medium 6 with respect to the exposure target film 12 is large, the supply amount of the immersion medium (e.g., liquid) per unit time may be increased using, e.g., the immersion medium supply device 25. If the exposure target film 12 exhibits liquid repellency, the immersion medium 6 is readily removed from the exposure target film 12 as the substrate 11 is scanned for scanning exposure. Hence, the liquid supply amount may be increased to suppress removal of the immersion medium 6.

(f) After that, immersion exposure is terminated in step S110.

Although the embodiment of the immersion exposure method exemplifies the case wherein the vapor pressure of the immersion medium is set to the saturated vapor pressure, the present invention is not limited to this. That is, although the vapor pressure in the immersion exposure apparatus 1 is set to the saturated vapor pressure of the immersion medium in step S104, the present invention is not limited to the saturated vapor pressure. Alternatively, the vapor pressure may be set to a value which does not exceed the saturated vapor pressure. The same applies to the first to third embodiments to be described hereinafter.

An immersion exposure method associated with vapor pressure control according to the first to third embodiments will be explained next.

(1) First Embodiment

Figure 4:
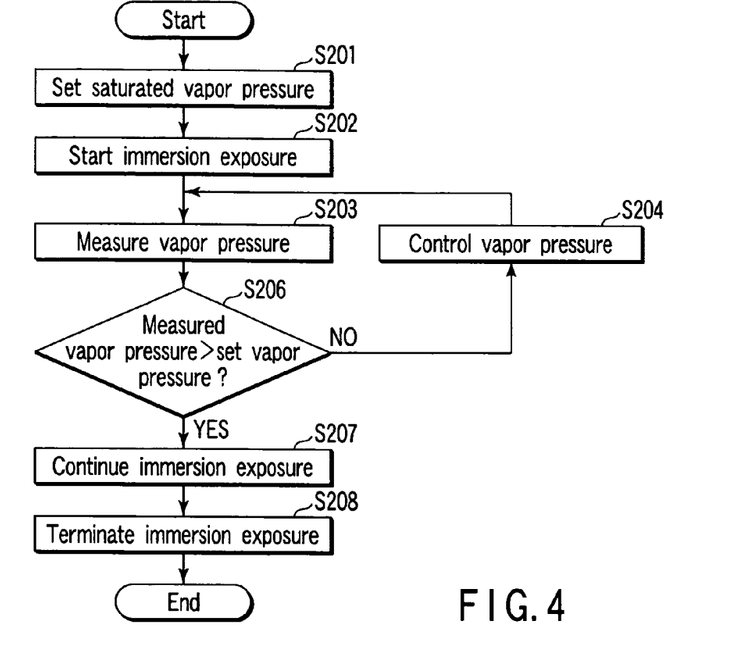
FIG. 4 is a flowchart showing an immersion exposure apparatus according to a first embodiment of the present invention.

The first embodiment will be explained with reference to the flowchart in FIG. 4.

In the first embodiment, an immersion exposure apparatus 1 in FIG. 1 is used. A hygrometer 51 is used as a vapor pressure measurement device. A humidifier 23 is used as a vapor pressure control means. The hygrometer 51 is installed at the location of the leading edge of a lens (a projection optical system termination portion 31), which falls outside the exposure optical path and immersion medium. Pure water is used as an immersion medium 6. An oxide film substrate is used as a substrate 11. A film in which a protective film, photoresist film, and anti-reflection film are stacked is used as an exposure target film 12. Air is used as the chamber atmosphere. An ArF excimer laser beam having a wavelength of 193 nm is used as exposure light.

In step S201, the above conditions are input to a control device 4 via an input/output device. The input conditions are compared with a database saved in a storage device 9 to set the vapor pressure in the immersion exposure apparatus 1 to the saturated vapor pressure of the immersion medium. In step S202, immersion exposure is started. In step S203, the vapor pressure in the chamber of the immersion exposure apparatus 1 is measured by a measurement device 5. The measured vapor pressure value is transmitted to the control device (computer) 4. In step S206, the vapor pressure value measured in step S203 is compared with the set vapor pressure by the control device 4. If the measured vapor pressure value is equal to or more than the set vapor pressure value, the substrate 11 is exposed by a step & scan scheme in step S207. If the measured vapor pressure value is less than the set vapor pressure, the control device 4 is allowed to transmit a gas supply start instruction to the humidifier 23 in step S204 to cause it to supply a saturated vapor pressure gas. During this time, vapor pressure measurement continues (step S203). When the measured vapor pressure value becomes larger than the set vapor pressure value, the control device 4 is allowed to transmit a gas supply end instruction to the humidifier 23 to stop vapor pressure measurement. After that, immersion exposure is terminated in step S208.

(2) Second Embodiment

Figure 5:
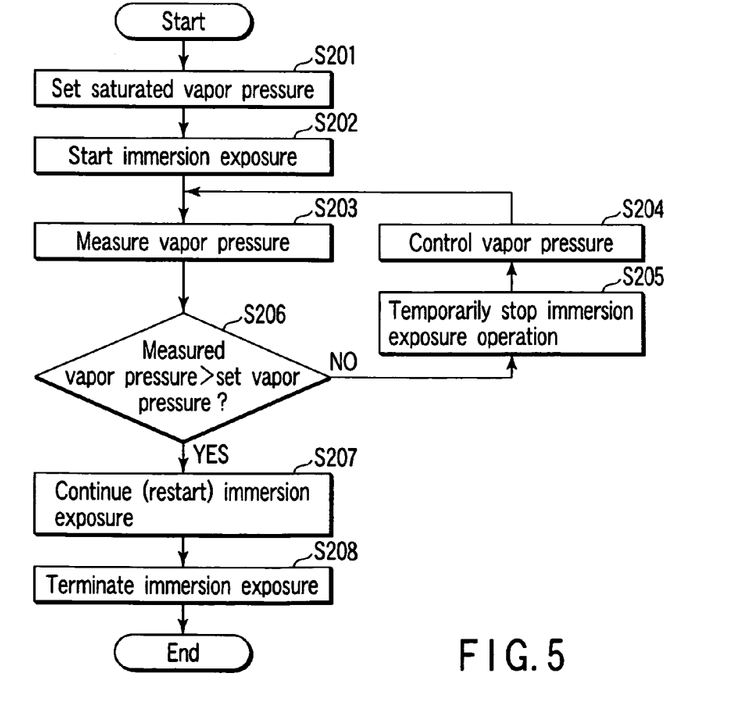
FIG. 5 is a flowchart showing an immersion exposure method according to a second embodiment of the present invention.

The second embodiment will be explained with reference to the flowchart in FIG. 5.

Immersion exposure is executed in the same way as in the first embodiment except for the following procedures. That is, if the measured vapor pressure value becomes smaller than the set vapor pressure value, step & scan exposure is ended to stop the immersion exposure operation at the stage of the next step in step S205. The vapor pressure of a gas near the immersion medium is controlled in the same manner as in the first embodiment. When the measured vapor pressure exceeds the set vapor pressure, the substrate 11 is moved to a position at which exposure is previously stopped, and the immersion exposure operation is restarted in step S207.

(3) Third Embodiment

Figure 6:
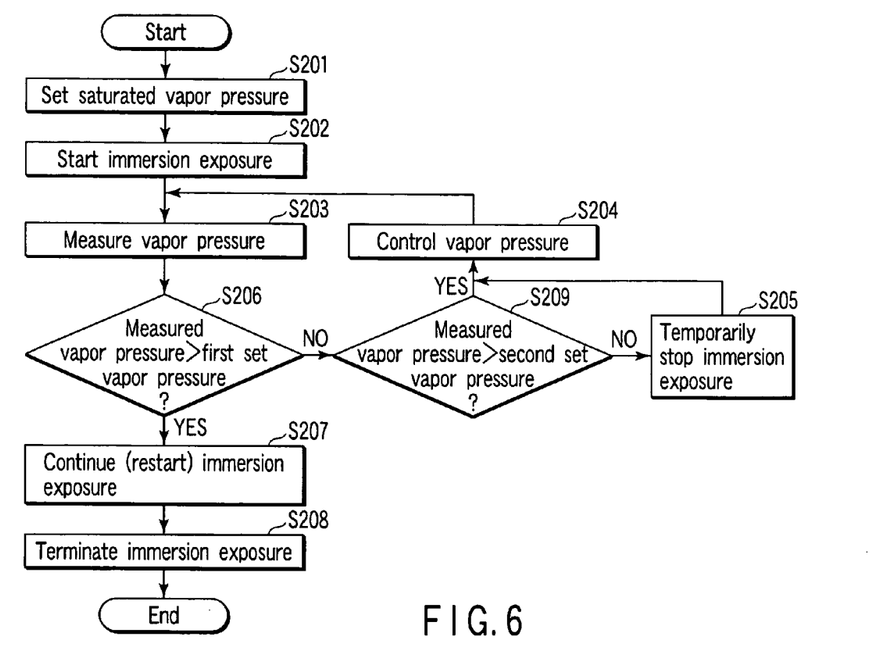
FIG. 6 is a flowchart showing an immersion exposure method according to a third embodiment of the present invention.

The third embodiment will be explained below with reference to the flowchart in FIG. 6.

Immersion exposure is executed in the same way as in the first embodiment except for the following procedures. If the vapor pressure is found to have decreased during exposure by measuring it in step S203, the vapor pressure is controlled while continuing exposure in step S207. For example, even after exposure is started using the method in the first embodiment, measurement by the measurement device 5 continues.

If the measured vapor pressure value becomes smaller than the first set vapor pressure value during immersion exposure in step S206, the vapor pressure of a gas near the immersion medium is controlled in the same manner as in the first embodiment while continuing exposure (step S204). If the measured vapor pressure value becomes smaller than the second set vapor pressure value in step S209, immersion exposure in progress is ended to stop the operation at the stage of the next step in step S205. The vapor pressure of the gas near the immersion medium is controlled in the same manner as in the first embodiment. When the vapor pressure exceeds the first set vapor pressure, the substrate 11 is moved to a position at which exposure is previously stopped, and the scan exposure operation is restarted.

In the second and third embodiments, instead of stopping the immersion exposure operation, a substrate stage 29 may be moved so as not to bring the immersion medium 6 into contact with the substrate 11.

As described above, the vapor pressure in an immersion exposure atmosphere is kept constant by activating the immersion exposure apparatus 1 to execute the immersion exposure method. This makes it possible to prevent evaporation of the immersion medium so as to prevent any variation in refractive index of the immersion medium 6. It is also possible to prevent migration of photoresist components so as to effectively prevent any variation in refractive index of the immersion medium 6 or any warp of the photoresist due to contamination of the immersion medium 6. As a result, according to the embodiments, a pattern can be transferred onto the substrate 11 with high pattern transfer accuracy under good environmental conditions. This makes it possible to provide a device which exhibits a desired performance.

Semiconductor Device Manufacturing Method

Figure 7:
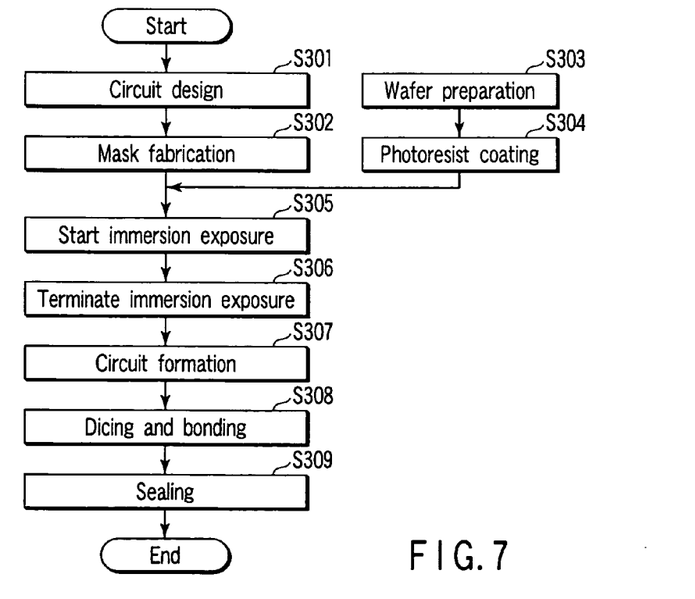
FIG. 7 is a flowchart showing a semiconductor device manufacturing method according to an embodiment of the present invention.

A semiconductor device manufacturing method will be explained next with reference to the flowchart in FIG. 7.

In step S301, the circuit of a semiconductor device is designed. In step S302, a mask 10 on which the designed circuit pattern is formed is fabricated. In step S303, a substrate 11 made of a material such as silicon is prepared. In step S304, the surface of the substrate 11 undergoes spin coating with an exposure target film (e.g., photoresist film) 12.

The substrate 11 and mask 10 are arranged on a substrate stage 29 and mask stage 27, respectively, in an immersion exposure apparatus 1. In step S305, immersion exposure is started to activate the immersion exposure apparatus 1 in accordance with the embodiments described above, thereby transferring the circuit pattern formed on the mask 10 onto the substrate 11. In step S306, immersion exposure is terminated. In step S307, the circuit is formed on the substrate 11. In step S308, the formed circuit portion is diced into chips. The obtained chips are bonded to the substrate surface. In step S309, the bonded substrate is sealed. A semiconductor device is thus manufactured.

Other Embodiments

Figure 8:
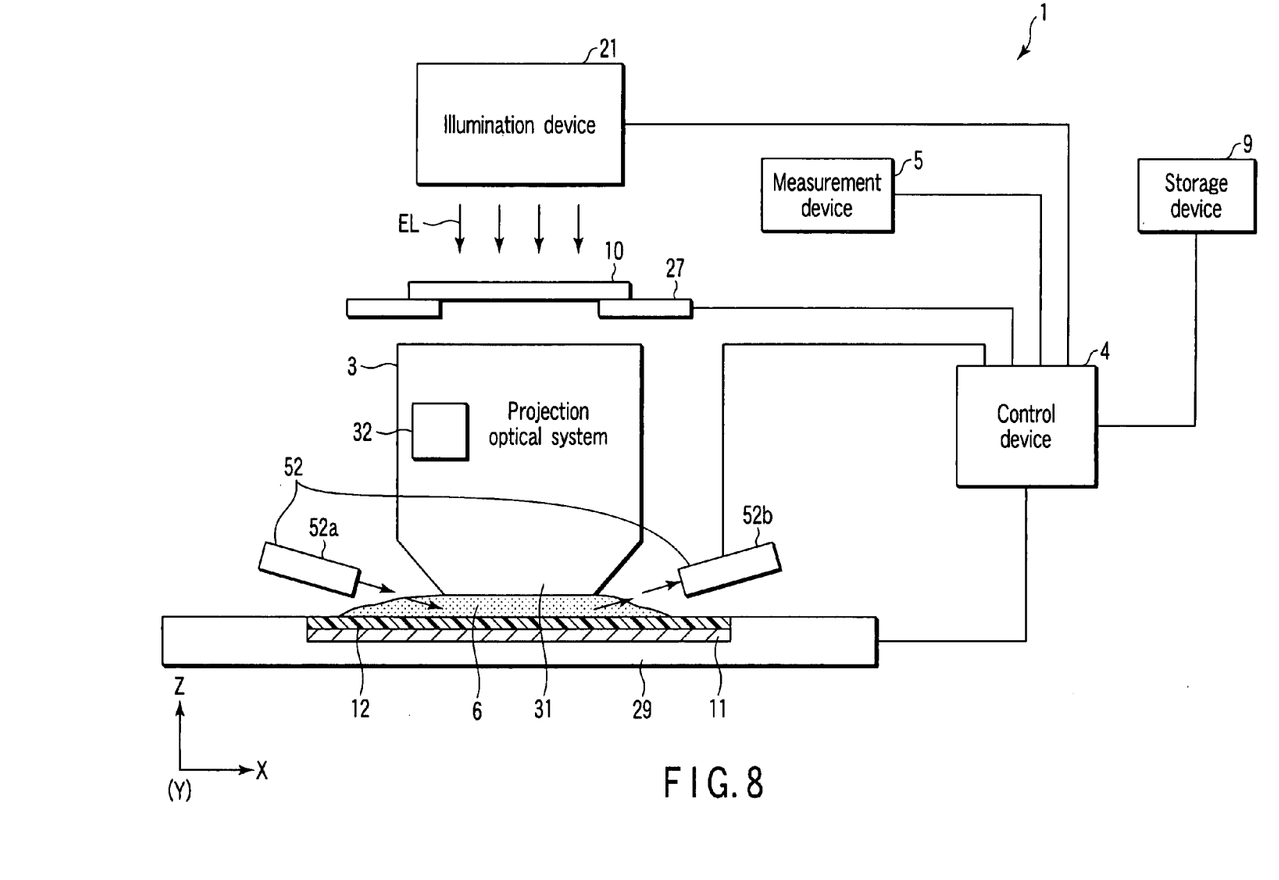
FIG. 8 is a view (side view along the Y and Z axes) showing the schematic arrangement of an immersion exposure apparatus according to a modification to the embodiment of the present invention.

While the above embodiments have described the present invention, it should not be construed as meaning that the present invention is limited to the description and accompanying drawings that constitute a part of this disclosure. From this disclosure, a variety of substitutable embodiments, examples, and operational techniques will be apparent to those skilled in the art. For example, an immersion exposure apparatus including a part of the arrangement described in the embodiments can be similarly used. A measurement device 5 of an immersion exposure apparatus 1 may comprise a substrate surface observation device 52 as shown in FIG. 8, in addition to a hygrometer 51, thermometer, and barometer. The substrate surface observation device 52 has a light-emitting unit 52a and light-receiving unit 52b to observe the surface of a substrate 11 (or exposure target film 12) using them. The substrate surface observation device 52 causes the light-emitting unit 52a to irradiate the substrate 11 with light. The substrate surface observation device 52 causes the light-receiving unit 52b to receive the light reflected by the substrate 11. On the basis of the thus obtained light reflectance of the substrate 11 (or exposure target film 12), the surface state of the substrate 11 (or exposure target film 12) may be grasped, thus controlling a vapor pressure in accordance with the surface state.

In this way, it is natural that the present invention incorporates various embodiments which are not described herein. Accordingly, the technical scope of the present invention is defined only by specific elements according to the invention associated with the appropriate claims from the above description.

As has been described above, according to the embodiments of the present invention, an immersion exposure method and immersion exposure apparatus capable of easily preventing evaporation of an immersion medium can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An immersion exposure method which executes immersion exposure for an exposure target film by transferring an image of a pattern formed on a mask onto the exposure target film through an immersion medium, comprising:

setting a first vapor pressure as a target value in an immersion exposure atmosphere which surrounds the immersion medium;

measuring a second vapor pressure in the immersion exposure atmosphere;

comparing the first vapor pressure with the second vapor pressure; and selecting whether to adjust the second vapor pressure in the immersion exposure atmosphere in accordance with the comparison result, wherein the first vapor pressure is set on the basis of information about a film member which forms the exposure target film.

2. The method according to claim 1, wherein the first vapor pressure includes a saturated vapor pressure of the immersion medium.

3. The method according to claim 1, wherein the second vapor pressure in the immersion exposure atmosphere is adjusted if it is found from the comparison result that the first vapor pressure does not coincide with the second vapor pressure, and immersion exposure is executed for the exposure target film if it is found that the first vapor pressure coincides with the second vapor pressure.

4. The method according to claim 1, wherein the second vapor pressure in the immersion exposure atmosphere is adjusted if it is found from the comparison result that the second vapor pressure has become lower than the first vapor pressure.

5. The method according to claim 1, wherein the immersion exposure operation is stopped and the second vapor pressure in the immersion exposure atmosphere is adjusted if it is found from the comparison result that the second vapor pressure has become lower than the first pressure, and the immersion exposure operation is restarted when the second vapor pressure has become higher than the first vapor pressure by adjusting the second vapor pressure.

6. The method according to claim 1, wherein the second vapor pressure in the immersion exposure atmosphere is adjusted on the basis of information about a substrate surface on which the exposure target film is formed.

7. The method according to claim 1, wherein a vapor pressure gas is supplied to the immersion exposure atmosphere to adjust the second vapor pressure.

8. An immersion exposure apparatus comprising:

a projection optical system which projects an image of a pattern formed on a mask onto an exposure target film;

a substrate stage which holds a substrate on which the exposure target film is formed;

an immersion medium supply unit which supplies an immersion medium to at least one portion of a space between the exposure target film and a termination portion of the projection optical system;

a measurement unit which measures a vapor pressure in an immersion exposure atmosphere which surrounds the immersion medium; and a control unit which compares the measured vapor pressure with a predetermined vapor pressure set in advance, and adjusts the vapor pressure in the immersion exposure atmosphere if the measured vapor pressure does not coincide with the predetermined vapor pressure, wherein the predetermined vapor pressure is set on the basis of information about a film member which forms the exposure target film.

9. The apparatus according to claim 8, wherein the termination portion of the projection optical system includes a part of the projection optical system arranged at a nearest position to the substrate, and comprises an optical element including one of a lens and plane-parallel plate.

10. The apparatus according to claim 8, wherein the projection optical system projects and forms by exposure the pattern of the mask on the exposure target film with a predetermined projection magnification.

11. The apparatus according to claim 8, wherein the immersion medium supply unit draws by suction the immersion medium which exists in the space between the exposure target film and the termination portion of the projection optical system under a certain condition.

12. The apparatus according to claim 8, wherein the immersion medium includes one of pure water and a fluorine-based fluid.

13. The apparatus according to claim 8, further comprising:
a humidifier which supplies a vapor pressure gas to the immersion exposure atmosphere,
wherein the control unit controls the humidifier to supply the vapor pressure gas to adjust the vapor pressure in the immersion exposure atmosphere if the measured vapor pressure does not coincide with the predetermined vapor pressure set in advance.

14. The apparatus according to claim 8, further comprising:
a storage unit which stores, as a database, various types of information associated with the immersion exposure which contain the predetermined vapor pressure,
wherein the control unit reads out the predetermined vapor pressure from the database stored in the storage unit.

15. The apparatus according to claim 14, wherein the various types of information include at least one of a manufacturing condition of the substrate, a material characteristic of the immersion medium, and contact angle information of the immersion medium with respect to the exposure target film formed on the substrate.

16. The apparatus according to claim 8, further comprising:
an observation unit which observes a surface of the exposure target film,
wherein the control unit adjusts the vapor pressure in the immersion exposure atmosphere on the basis of surface information of the exposure target film, which is obtained by the observation unit.

17. The apparatus according to claim 8, further comprising:
an illumination unit including a light source and an illumination system which illuminates the mask with light from the light source; and
a mask stage which supports the mask, and in which the mask stage allows the mask to be interposed between the illumination unit and the projection optical system.

18. A semiconductor device manufacturing method comprising:
forming an exposure target film on a substrate;
supplying an immersion medium to at least one portion of a space between the exposure target film and a projection optical system which projects an image of a pattern formed on a mask onto the exposure target film;
setting a first vapor pressure as a target value in an immersion exposure atmosphere which surrounds the immersion medium, the first vapor pressure being set on the basis of information about a film member which forms the exposure target film;
measuring a second vapor pressure in the immersion exposure atmosphere;
transferring the image of the pattern formed on the mask onto the exposure target film through the immersion medium;
comparing the first vapor pressure with the second vapor pressure; and
selecting whether to adjust a vapor pressure in the immersion exposure atmosphere in accordance with the comparison result.

* * * * *